(12) United States Patent
Nystuen et al.

(10) Patent No.: US 6,603,706 B1
(45) Date of Patent: Aug. 5, 2003

(54) METHOD AND APPARATUS FOR SYNCHRONIZATION OF READ DATA IN A READ DATA SYNCHRONIZATION CIRCUIT

(75) Inventors: John M. Nystuen, Burnsville, MN (US); Gregory F. Hammitt, Eagan, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/322,933

(22) Filed: Dec. 18, 2002

(51) Int. Cl.[7] .................................................. G11C 7/00
(52) U.S. Cl. ................ 365/233; 365/230.04; 365/233.5
(58) Field of Search .............................. 365/233, 233.5, 365/230.04

(56) References Cited

U.S. PATENT DOCUMENTS

| 6,078,546 | A | * | 6/2000 | Lee | ............................. 365/233 |
| 6,452,865 | B1 | | 9/2002 | Wolford | ..................... 365/233 |
| 6,542,433 | B2 | * | 3/2003 | Ka | .............................. 365/233 |

* cited by examiner

Primary Examiner—Vu A. Le
(74) Attorney, Agent, or Firm—Westman, Champlin & Kelly

(57) ABSTRACT

A read data synchronization circuit for use in a Double Data Rate (DDR) memory system is provided. The read data synchronization circuit provides programmable timing signals for use in synchronizing read data.

20 Claims, 5 Drawing Sheets

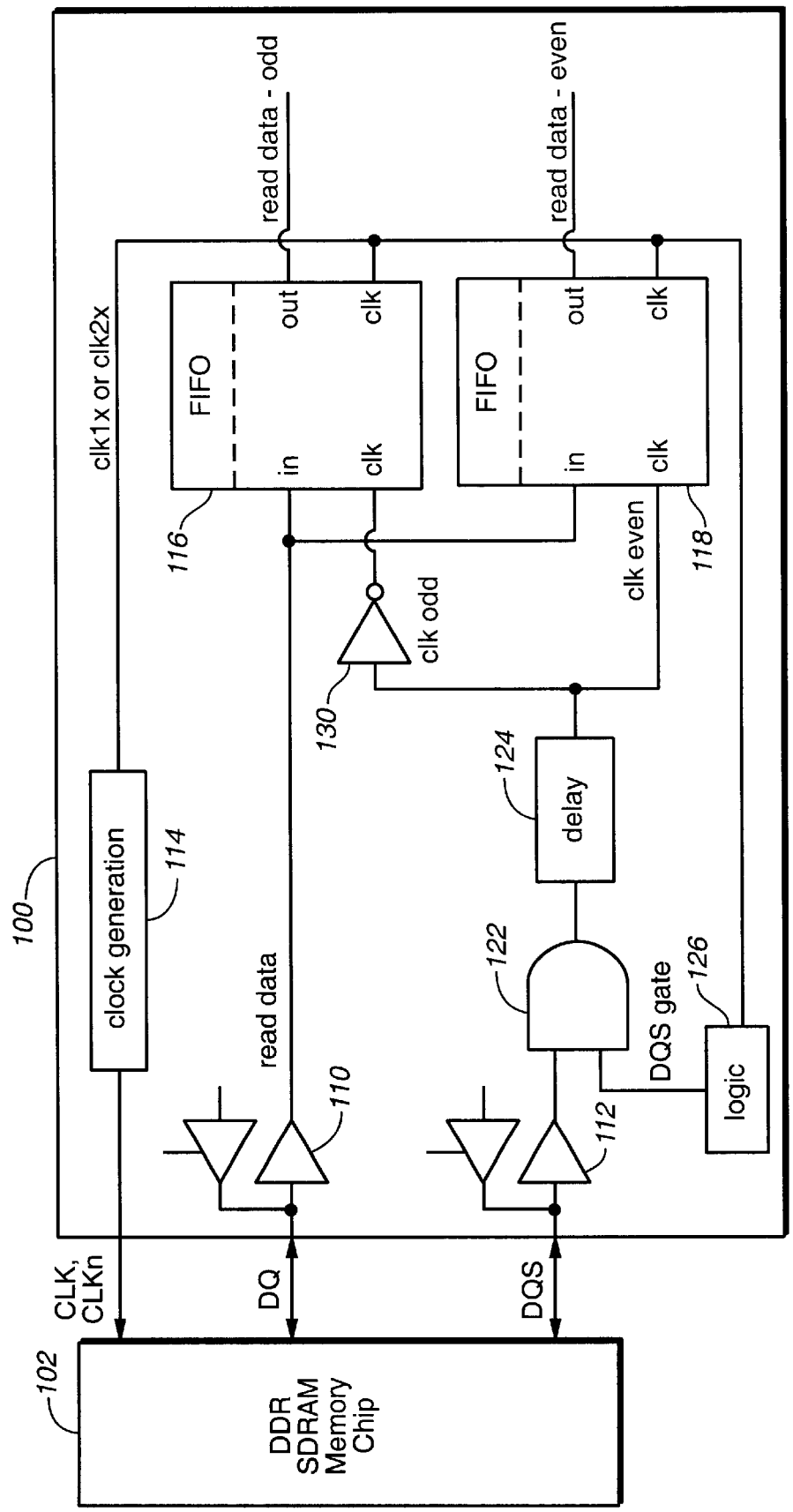
FIG._1
*(PRIOR ART)*

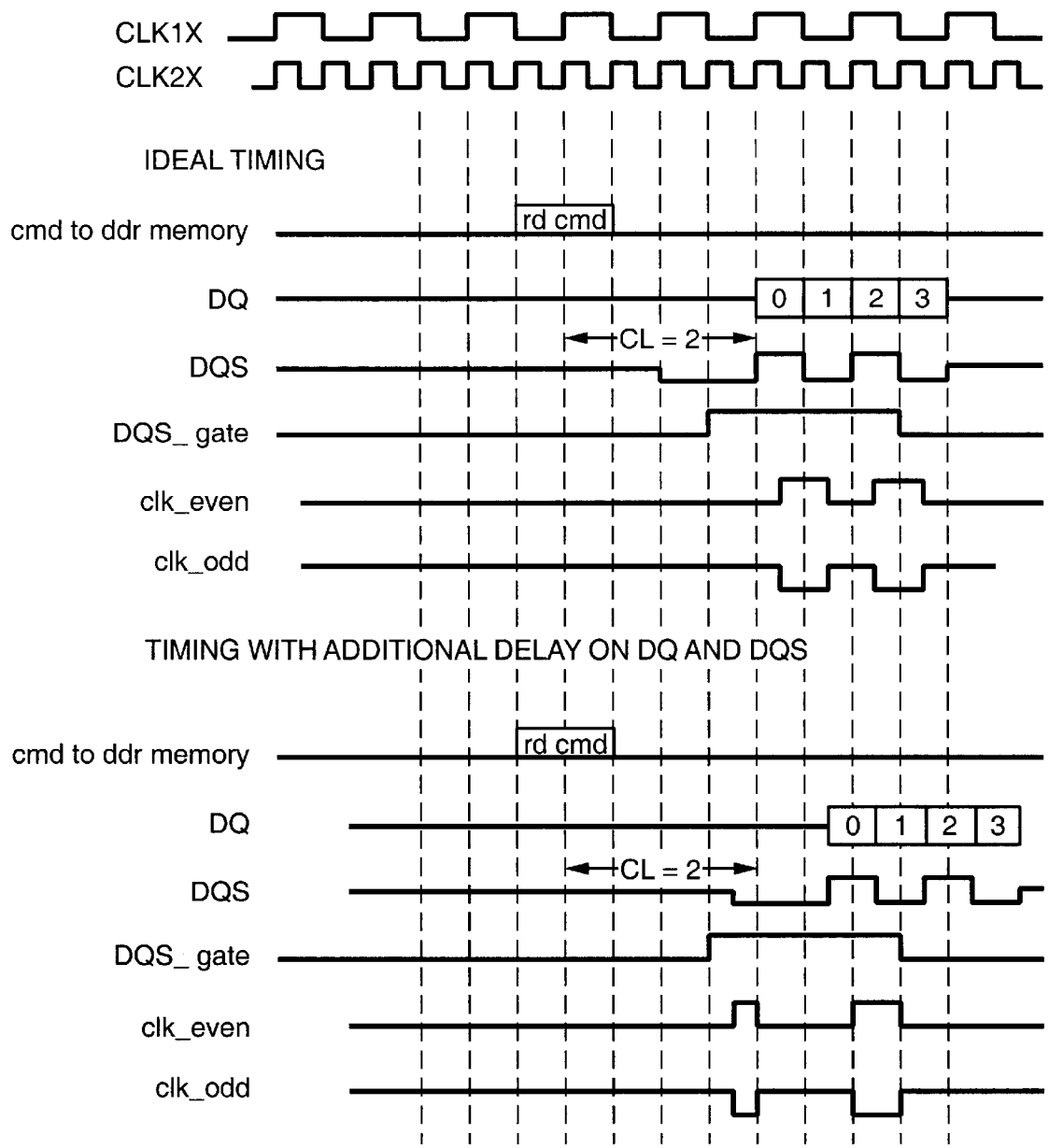
FIG._2

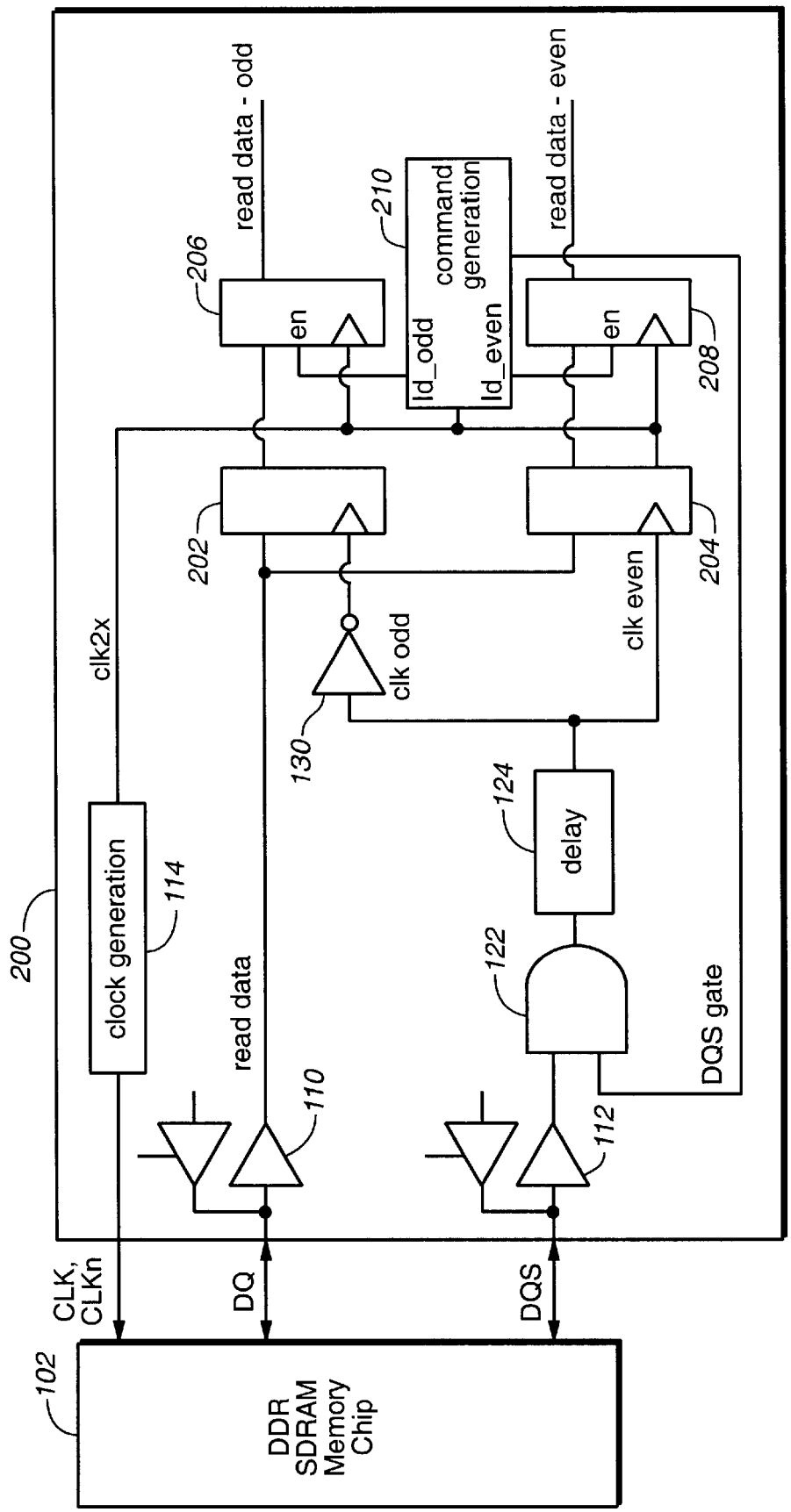
FIG._3

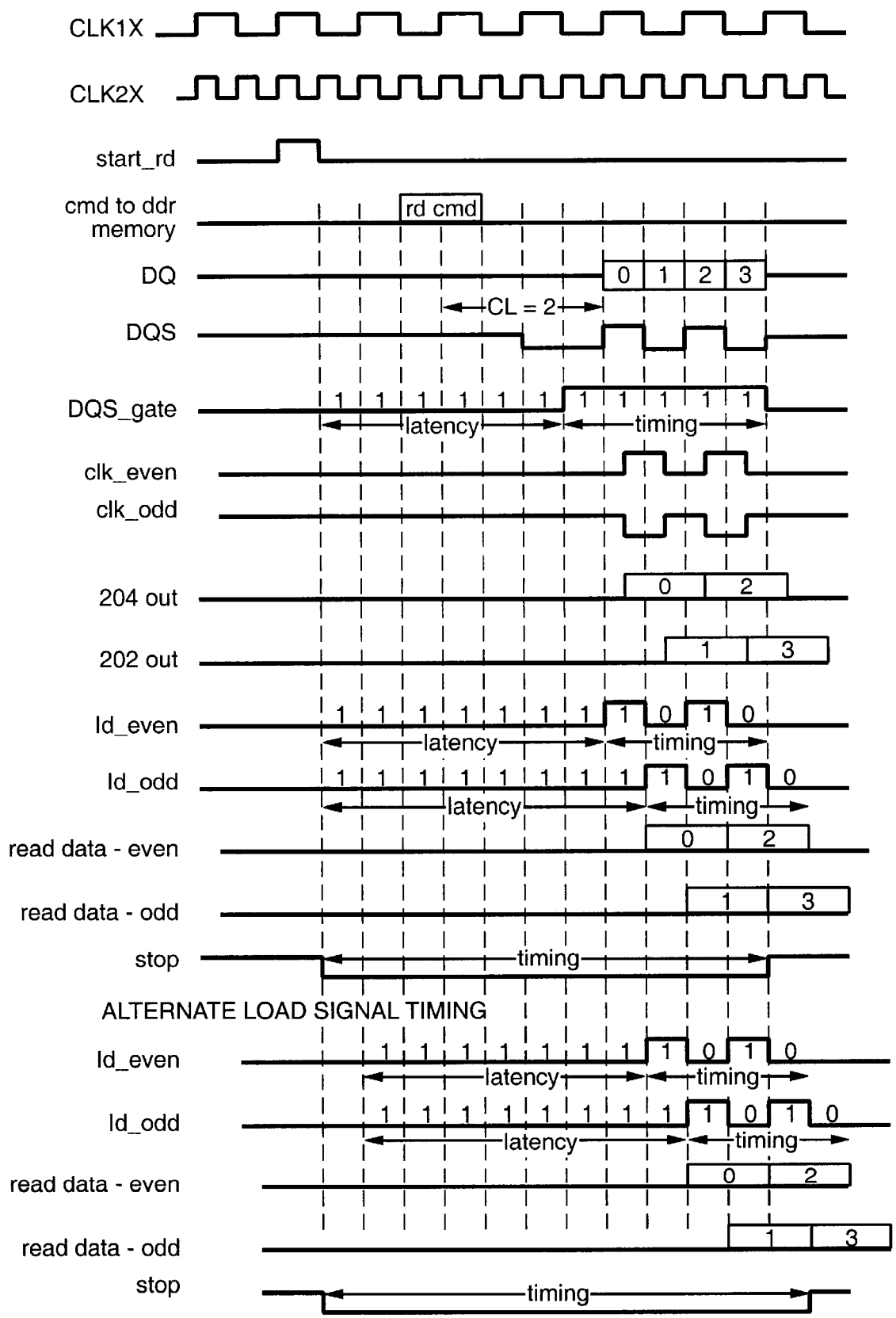
FIG._4

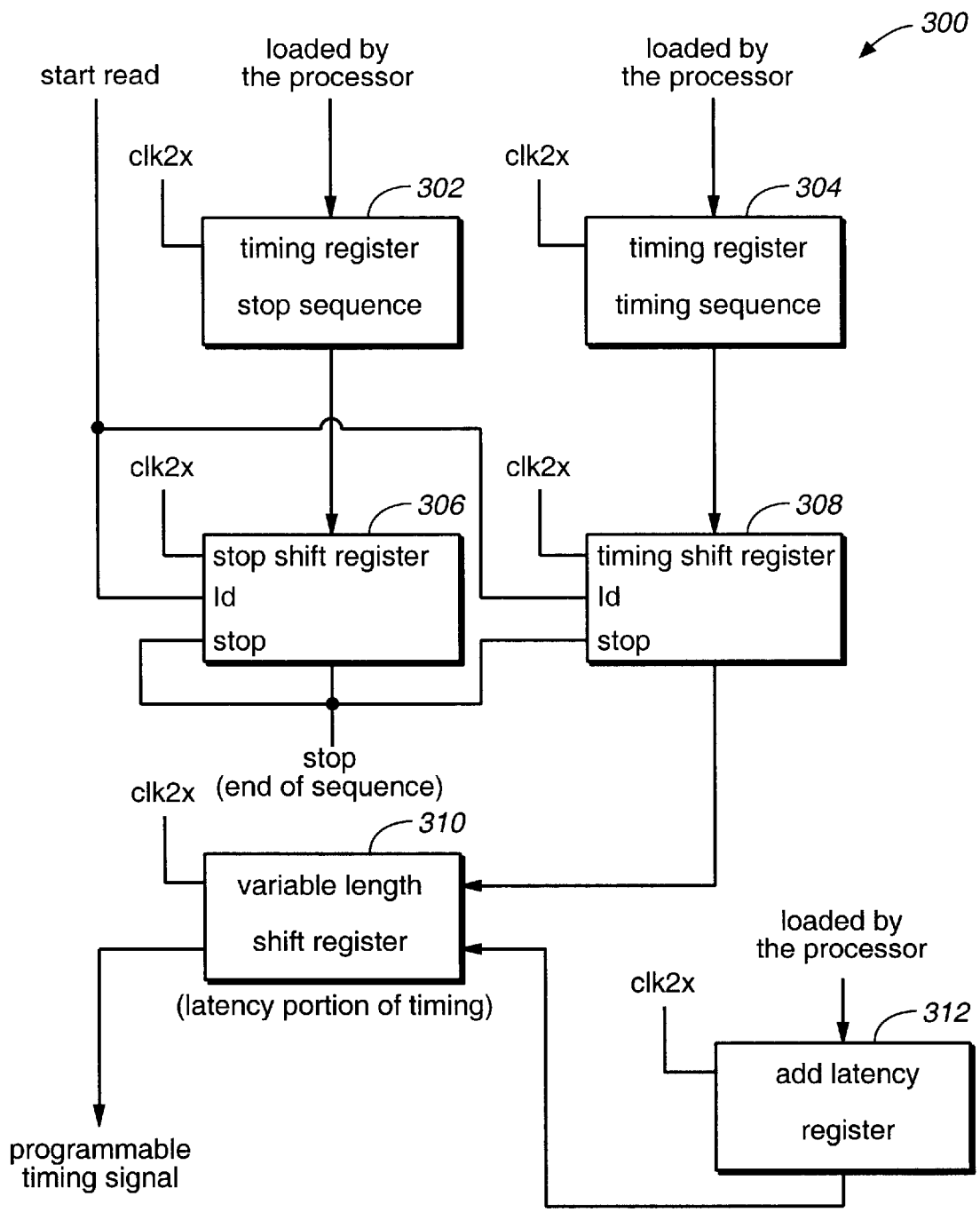
FIG._5

METHOD AND APPARATUS FOR SYNCHRONIZATION OF READ DATA IN A READ DATA SYNCHRONIZATION CIRCUIT

FIELD OF THE INVENTION

The present invention relates to semiconductor integrated circuits and more particularly to synchronizing read data from a memory device with a read data synchronization circuit's clock signal.

BACKGROUND OF THE INVENTION

Certain types of memory devices generate a clock strobe signal having edges that are aligned with changes in the read data. A double data rate (DDR) synchronous dynamic random access memory (SDRAM) transfers data on each rising and falling edge of the clock strobe signal. A DDR SDRAM therefore transfers two data words per clock cycle.

A read data synchronization circuit is often used to coordinate the transfer of data to and from a memory device, such as a DDR SDRAM. The read data synchronization circuit provides a local clock signal to the memory device for synchronizing read and write operations. The clock strobe signal generated by the memory device with the read data has predefined phase constraints with respect to the local clock signal provided by the read data synchronization circuit. The read data synchronization circuit uses the clock strobe signal for determining when the read data is valid and can therefore be latched. The times at which the read data is latched are preferably synchronized relative to the clock strobe signal so as to latch the read data in the middle of the valid data window.

Due to varying propagation delays from the read data synchronization circuit's local clock signal and the clock strobe signal that is received from the memory device, the phase relationship between the captured read data and the local clock signal can change from one device to the next and can change over time. These changes in phase alignment can be caused by input/output (I/O) pad delay variations, power supply fluctuations, process variations, temperature variations and variations in the clock input to data clock strobe output characteristics of the memory device. In certain cases these changes can be large enough to cause the captured read data to cross a metastable region with respect to the read data synchronization circuit's clock.

Due to these and other factors, accurate synchronization of the captured read data to the read data synchronization circuit's clock requires the phase relationship between the data output clock strobe and the read data synchronization circuit's clock to be maintained. Typically, a clock gating technique is employed which can introduce errors into data synchronization.

SUMMARY OF THE INVENTION

A read data synchronization circuit for use in a Double Data Rate (DDR) memory system includes a read data bus configured to couple to a bi-directional data bus (DQ) and a data strobe line configured to couple to a bi-directional data strobe line (DQS). A first read data even register couples to the read data line and is clocked by a strobe pulse on the data strobe line. A first data odd register couples to the read data line and clocked by an inverted strobe pulse on the data strobe line. A second data even register is clocked by a clock signal and has an enable input and a read data even output. A second data odd register is clocked by the clock signal and has an enable input and a read data odd output. A command generation circuit is configured to provide the enable signals to the enable inputs of the second even and second odd registers.

BRIEF DESCRIPTION OF THE DRAWINGS

FIG. 1 is a simplified block diagram of a prior art read data synchronization circuit within a Double Data Rate (DDR) read data synchronization circuit.

FIG. 2 is a timing diagram for the read data synchronization circuit of FIG. 1.

FIG. 3 is a block diagram of a read data synchronization circuit in accordance with one embodiment of the present invention.

FIG. 4 is a timing diagram for the read data synchronization circuit of FIG. 3.

FIG. 5 is a block diagram of command generation circuitry of FIG. 3.

DETAILED DESCRIPTION OF THE PREFERRED EMBODIMENTS

DDR SDRAM memories have found widespread use due to their speed and efficiency for storing data. DDR SDRAM memories are relatively complex devices and require a sophisticated read data synchronization circuit to control operation of the memory. One function of the read data synchronization circuit is the synchronization of read data. The present invention is directed to the synchronization of read data in such a read data synchronization circuit. A complete specification of DDR operation can be found in the Jedec specification JESD79.

FIG. 1 is a block diagram showing a prior art DDR read data synchronization circuit 100 coupled to a DDR SDRAM memory chip 102. A number of connections extend between read data synchronization circuit 100 and memory chip 102 including a CLK, CLKn (clock) line, a DQ (data) line, and a DQS (data strobe) line. The DQ and DQS lines operate bi-directionally and are switched within read data synchronization circuit 100 using bidirectional buffers 110 and 112, respectively. Read data synchronization circuit 100 further includes clock generation circuitry 114, read data odd FIFO 116 and read data even FIFO 118.

The read data from the DQ line is applied to the inputs of FIFOs 116 and 118. A clock signal is applied to clock inputs of FIFOs 116 and 118 using a data strobe from the DQS line through AND gate 122 and a delay 124. The gate 122 is controlled by gate logic 126. The clock signal into the odd FIFO 116 is inverted using an inverter 130. A read data odd output and a read data even output is clocked from FIFOs 116 and 118, respectively, using a clock signal from clock generation circuitry 114.

In operation, a read command is sent to the memory chip 102. After the CAS (Column Access Strobe) latency time is met, the read data is driven on the DQ bi-directional bus. The memory chip has a configuration register that indicates how many beats of data should be sent on any read access. (A "beat" refers to the transfer of data during a clock cycle.) The configuration register in memory chip 102 is initialized at power up and can be set to two, four or eight beats in length. Typically, four beats is used.

In a DDR, the read data protocol is source synchronous. In other words, a clock signal is sent with the data and transitions in the clock are such that they are located at transitions of the beats on the DQ data bus. The clock function is delivered using the DQS bi-directional bus.

In operation of double data rate memory, both the rising edge and the falling edge of the strobe on the DQS line is used by the read data synchronization circuit 100 to clock the read data on the DQ line. The strobe is delayed in the read data synchronization circuit 100 by delay 124 such that its transitions are centered in the center window (or "eye") of each beat on the DQ data bus.

Because the DQS bus is bi-directional, it must be gated using gate 122 such that inadvertent clock pulses do not reach the FIFOs 116 and 118. In the embodiment of FIG. 1, the DQS strobe is gated by gate 122 and then delayed by delay 124 for approximately a quarter of a period of the single clock rate (CLK1X). The delayed strobe is then used to clock the input side of the FIFOs 116 and 118. Inverter 130 is provided such that both edges of the signal are used for clocking.

The two FIFOs 116 and 118 are configured such that the data is passed between two different clock domains. The input side of the FIFOs 116 and 118 are clocked by the delayed DQS strobe pulse while the output sides are clocked by the internal clock 114 of the read data synchronization circuit 100. This configuration assumes that the two different clock signals or ("domains") are asynchronous and the relationship between the two clock edges cannot be determined.

After the read data is clocked into the FIFOs 116 and 118, the read data synchronization circuit 100 can clock the data out of the FIFOs in a synchronous manner using the clock generation circuitry 114. Note that FIFO 116 provides odd read data and FIFO 118 provides even read data. The designation of even and odd read data refers to the order of the beats of data during a read burst. If the beats are numbered starting with a zero, the order is zero, one, two, three, for a four beat burst. The rising edge of the DQS strobe pulse will clock beats zero and two (even) and the falling edge of the pulse will clock beats one and three (odd).

FIG. 2 is a timing diagram for the read data synchronization circuit 100 of FIG. 1. FIG. 2 shows both and ideal timing signals and timing signals when an additional delay is introduced on DQ and DQS. In the ideal timing portion of the diagram, the read command is sent to the memory 102. With a CAS latency of two (CL=2), the read data begins two clock cycles later which appears on the DQ bus. The read data is shown on the DQ bus with four beats of data, zero, one, two and three. The DQS strobe has a one clock period preamble followed by four transitions, then a half clock period postamble and finally returns to a tri-state level. The rising and falling edges are aligned with the transitions of the beats on the DQ bus.

The DQS_gate signal applied to gate 122 by logic 126 is aligned with the DQS signal such that the logical AND of the two signals followed by a one quarter clock period delay forms the clock_even and clock_odd signals applied to FIFOs 118 and 116, respectively.

Although the FIFO technique illustrated in FIG. 1 is a known technique for allowing data to cross between two different clock domains, the configuration accentuates another problem. The logical AND of the DQS and DQS_ gate signals results in a gated clock signal. Gating a clock signal raises design problems and can introduce errors in clocking. When a gated clock is used, the gating and the clock signal must be properly aligned. If the gate and the clock signals drift in different directions, glitches and/or narrow clock pulses can occur at the clock inputs resulting in errors. Further, propagation delays from the memory chips, across board traces and into the read data synchronization circuit, along with a clock skew can make maintaining this synchronization quite complex.

As illustrated in FIG. 2, when an additional delay is introduced into the DQ and DQS signals, the DQS and the DQS_gate signals are no longer aligned. This results in clock edges of the clock_even and clock_odd clocks occurring where the data on the DQ line is not valid as well as missing clock edges on the back end of the signal where the data is valid.

In typical prior art configurations, attempts to address this problem have been directed at developing various logic techniques for implementation in logic block 126 of read data synchronization circuit 100. Further, with current circuitry design, there are no low latency paths. In a processor application, latency of a read request may be critical. The process can be stalled while waiting for the data to be retrieved. The prior art technique illustrated in FIG. 1 of using the FIFOs to synchronize the read data also introduces an additional latency period because extra clocks cycles are required to perform the synchronization internally within the FIFOs 116 and 118.

FIG. 3 is a simplified block diagram of a read data synchronization circuit 200 in accordance with the present invention coupled to a DDR SDRAM memory chip 102. Elements within read data synchronization circuit 200 shown in FIG. 3 which are similar to elements in read data synchronization circuit 100 of FIG. 1 have the same numbering.

In contrast with the prior art design discussed with respect to FIG. 1, the present invention begins with the assumption that the two clock domains are at least somewhat synchronous. Instead of using FIFOs 116 and 118 shown in FIG. 1, the present invention uses first odd and even registers 202 and 204, respectively and second odd and even registers 206 and 208, respectively. As discussed below, a command generation circuit 210 provides DQS_gate signal to gate 122. Circuit 210 provides programmable timing signals that are positioned such that the DQS read data can be clocked reliably using the clock signal generated by clock generation circuitry 114 of read data synchronization circuit 200. In this example, the double rate clock (CLK2X) is used and provides sufficient resolution to adjust the position of the timing signals for the set up and hold times of the read data registers 206 and 208.

The configuration shown in FIG. 3 reduces the problems associated with a gated clock discussed above. Although the DQS clock signal is still gated, because programmable clock enables are used, an additional level of protection is provided such that a glitch that appears on the clock_even and clock_odd signals is ignored.

Further, the position and duration of the DQS_gate signal can be programmed and controlled as desired. The position of the DQS_gate clock is less critical because even upon the occurrence of a glitch, the read data registers 206 and 208 will not have the bad data clocked into them.

FIG. 4 is a timing diagram showing operation of read data synchronization circuit 200 shown in FIG. 3. The clock CLK1X, CLK2X, command to DDR memory, DQ, DQS, DQS_gate, CLK_even and CLK_odd signals are identical to those shown in FIG. 2. The timing diagram shown in FIG. 4 also shows the outputs from registers 202 and 204. The ld_even and ld_odd signals are positioned such that the next rising edge of the CLK2X clock will clock the data into the appropriate read data registers 206 or 208. An alternate load signal timing diagram is also illustrated in FIG. 4 where the load signals ld_even and ld_odd are programmed to occur one CLK2X clock cycle later.

As illustrated by comparing the two different load signals with the timing for registers 206 and 208, there are two possible positions to capture the data. Depending on the actual delay, one of the two possible positions is optimum and provides the ideal timing. When the actual delay is different from the ideal delay, the change in the programming of the three timing signals (ld_even, ld_odd and DQS_gate) can be adjusted to account for the delay. Even the worst case timing example can be corrected by simply programming the timing signals to account for the delay.

FIG. 5 is a simplified block diagram which illustrates timing logic 300 for use in command generation circuitry 210. Each timing signal (ld_even, ld_odd and DQS_gate) uses one circuit similar to that shown in FIG. 5. Although the timing signals could be generated using counters and state machines, such a configuration is difficult to implement. The timing diagram of FIG. 4 shows a single read command being sent to the memory. However, read commands can be sent in a four beat mode every other clock. As shown in FIG. 4, the read timing sequence is barely beginning after two clocks. Being required to handle multiple timing sequences, adds much complexity to a state machine. Also, when required to handle CAS latencies other than 2, adds more complexity.

The embodiment illustrated in FIG. 5, provides an implementation which, unlike state machines, provides a simple hardware structure that is easily programmable to handle different timing and different CAS latencies. Multiple timing sequences are also handled easily. Timing logic 300 includes a stop sequence timing register 302, a timing sequence timing register 304, stop shift register 306 and timing shift register 308, a variable length shift register 310 and an add latency register 312. A stop sequence is loaded by the processor (not shown) into register 302. A timing sequence is loaded by the processor into register 304. The latency delay is adjusted by the processor through an input to register 312. The various registers 302–312 are clocked using the CLK2X signal.

The "timing" portion of the programmable timing signals shown in FIG. 4 (ld_even, ld_odd, DQS_gate) is generated by the timing shift register 308. The "latency" portion of the timing signal is generated by the variable length shift register 310 which is controlled by add latency register 312.

Timing logic 300 generates the timing signal when the start read signal applied to registers 306 and 308 goes active. The timing shift register 308 will begin to clock out the desired pattern which is then delayed by variable length shift register 310. The stop signal provided by stop shift register 306 is used to determine when the sequence is complete. The stop signal is not processed by a variable length shift register. The stop signal goes inactive on the first clock pulse and remains inactive until the sequence is complete. When complete, the stop signal forces the shift register to stop.

In the timing diagram of FIG. 4, the timing signals show portions identified as "latency" and portions identified as "timing." The latency portion of the timing signal indicates that the variable length shift register 310 must be configured to be eight bits long. To accomplish this, the add latency register 312 is loaded with eight ones in the most significant bits, with the remaining lesser significant bits set to zero. With the constant loaded into the add latency register 312, it configures the variable length shift register to the number of stages as specified by the number of ones in the most significant bits of the add latency register 312.

Thus, the variable length shift register 310 delays the timing signal a specified number of clocks. Without the latency portion, the ld_even timing portion would occur immediately. The latency portion of the timing signal allows the user to program the ideal position of the timing portion.

In order to generate the timing signals, the boundary must be determined between the latency portion of the signal and the timing portion. The timing portion is to be the value that will repeat when multiple read bursts are performed back to back. For example, the ld_even signal has a pattern of 1010 for its timing register 304. If four read bursts are performed in sequence, then the overall timing pattern desired would be for the latency field followed by 1010, another 1010, another 1010 and finally a fourth 1010. In other words, after the start read signal, there are seven clock cycles of delay with the signal inactive followed by a pattern 1010101010101010.

The DQS_gate signal strobes the gate 122. Since the DQS bus has a tri-state bus, there are many instances in which the bus is floating. Thus the DQS bus must be gated to prevent spurious noise from being inserted into the surrounding circuits. The value to load into the registers 302, 304 and 312 can be read directly from the timing diagram shown in FIG. 4. For the latency register, the diagram indicates six clock cycles of latency are required. As these bits go into the most significant bits of the latency register 312, the register should be loaded with 0xFC00 such that the six most significant bits are set. For the DQS_gate signal, the timing register 304 requires six ones and therefore must be loaded with 0xFC00_0000.

For the ld_even signal, the example shown at FIG. 4 illustrates a CAS latency of two. This latency can be added to the appropriate latency register 312. Based upon a particular implementation, other latencies can be programmed. As illustrated in the timing diagram of FIG. 4, the ld_even signal is aligned with the data on the DQ bus. The latency field requires seven clock cycles of delay so the latency register 312 for the ld_even signal must be loaded with 0xFE00. The timing register must be loaded with 0xA000_0000.

The ld_odd signal is similar to the ld_even signal except that it clocks during the odd beats of the read burst. The latency field requires eight clocks of delay, one more than the ld_even signal. Therefore, the latency register 312 for the ld_odd signal must be loaded with 0xFF00. The timing registers have the same pattern as the ld_even signal, except with one more clock period of latency. Therefore, the same value, of 0xA000_0000 must be loaded into the timing register 304 for the ld_odd signal.

The present invention provides a relatively simple implementation which addresses issues related to a gated clock. The timing signals are programmable to adjust for different propagation delays and different CAS latencies. The timing signals can be easily programmed using timing registers. The values used to program the timing registers can be read directly from a timing diagram. The invention can be implemented for data streaming or with a FIFO. Further, this configuration reduces the latency caused by the read data synchronization circuit. If a FIFO is used in the implementation, the FIFO can be simpler than FIFOs in prior art read data synchronization circuit because only a single clock cycle is required. The register pairs and the FIFO implementations are examples of data transition circuits which are used to transition data between the two clock domains.

Although the present invention has been described with reference to preferred embodiments, workers skilled in the art will recognize that changes may be made in form and detail without departing from the spirit and scope of the invention.

What is claimed is:

1. A read data synchronization circuit for use in a Double Data Rate (DDR) memory system, comprising:
    a read data line configured to couple to a bi-directional data bus (DQ);
    a data strobe line configured to couple to a bi-directional data strobe bus (DQS);
    a first data even transition circuit having an input coupled to the read data line which is clocked by a strobe pulse on the data line and a read data even output which is clocked by a clock signal;
    a first data odd transition circuit having an input coupled to the read data line which is clocked by a strobe pulse on the data line and a read data odd output which is clocked by a clock signal; and
    a command generation circuit configured to provide programmable enable signals to the enable inputs of the data even output which is enabled in response to an enable input transition circuit and the data odd output which is enabled in response to an enable input transition circuit.

2. The apparatus of claim 1 wherein the data even transition circuit comprises:
    a first read data even register coupled to the read data line and clocked by a strobe pulse on the data strobe line;
    a second data even register clocked by a clock signal, the second data even register having a enable input and a read data even output;
    the data odd transition circuit comprises:
        a first data odd register coupled to the read data line and clocked by an inverted strobe pulse on the data strobe line;
        a second data odd register clocked by the clock signal, the second data odd register having an enable input and a read data odd output.

3. The apparatus of claim 1 including a DQS gate which gates a strobe on the data strobe bus (DQS).

4. The apparatus of claim 3 wherein the command generation circuit provides a DQS gate signal to the DQS gate.

5. The apparatus of claim 1 wherein the data even transition circuit and data add transition circuit register are implemented in a FIFOs.

6. The apparatus of claim 1 wherein the clock signal is generated by the read data synchronization circuit.

7. The apparatus of claim 1 wherein the command generation circuit includes a variable length shift register.

8. The apparatus of claim 7 including a latency register coupled to the variable length shift register configured to store a latency timing code.

9. The apparatus of claim 1 wherein the command generation circuit includes a timing register coupled to a shift register configured to provide a programmable timing sequence.

10. The apparatus of claim 1 wherein the programmable timing sequence provides the enable signal to at least one of the data even and data odd transition circuits.

11. The apparatus of claim 9 wherein the programmable timing signal provides the DQS gate signal to the DQS gate.

12. The apparatus of claim 2 wherein the DQS gate comprises an AND gate.

13. The apparatus of claim 2 including a delay coupled to an output of the DQS gate.

14. The apparatus of claim 13 wherein an output from the delay gates the read data even transition circuit.

15. The apparatus of claim 13 including an inverter and wherein an output from the delay is applied to the inverter and gates the data odd transition circuit.

16. A method for reading data in a double data rate (DDR) memory system, comprising:
    receiving read data on a bi-directional data bus (DQ);
    receiving a data strobe on a bi-directional data strobe bus (DQS);
    clocking read data into a read data even transition circuit based upon a strobe pulse from the data strobe bus;
    clocking read data into a read data odd transition circuit based upon a strobe pulse from the data strobe bus;
    enabling the read data even transition circuit to provide a read data even output;
    enabling the read odd transition circuit to provide a read data odd output; and
    generating programmable enable signals applied to enable inputs of the data even and second data odd transition circuits.

17. The method of claim 16 including gating a DQS gate with a programmable gate signal.

18. The method of claim 16 wherein the transition circuit are implemented with FIFOs.

19. The method of claim 16 wherein the transition circuits are implemented with data registers.

20. A read data synchronization circuit for use in a double data rate (DDR) memory system, comprising:
    means for receiving read data on a bi-directional data bus (DQ);
    means for receiving a data strobe on a bi-directional data strobe bus (DQS);
    means for read data into a first read data even register based upon a strobe pulse from the data strobe bus;
    means for read data into a first read data odd register based upon a strobe pulse from the data strobe bus;
    means for enabling a second data even register coupled to the first data read register configured to provide a read data even output;
    means for a second data odd register coupled to the first data read register configured to provide a read data odd output; and
    means for generating programmable enable signals applied to enable inputs of the second data even and second data odd registers.

* * * * *